United States Patent
Yamaguchi et al.

(10) Patent No.: US 6,949,174 B2
(45) Date of Patent: Sep. 27, 2005

(54) MILLING APPARATUS

(75) Inventors: Hirohito Yamaguchi, Kanagawa (JP);
Masahiro Kanai, Tokyo (JP); Atsushi Koike, Kanagawa (JP); Katsunori Oya, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 169 days.

(21) Appl. No.: 10/444,990

(22) Filed: May 27, 2003

(65) Prior Publication Data

US 2003/0221781 A1 Dec. 4, 2003

(30) Foreign Application Priority Data

May 28, 2002 (JP) ........................................ 2002-153869

(51) Int. Cl.[7] .............................. C23C 14/35; C23F 1/00
(52) U.S. Cl. ............................ 204/298.34; 204/298.37; 156/345.3; 156/345.37; 156/345.19
(58) Field of Search ..................... 204/298.31, 298.37, 204/298.34, 298.3; 156/345.3, 345.37, 345.19

(56) References Cited

U.S. PATENT DOCUMENTS

| | | | |
|---|---|---|---|
| 5,038,713 A | 8/1991 | Kawakami et al. ......... | 118/723 |
| 5,266,146 A * | 11/1993 | Ohno et al. ............. | 156/345.42 |
| 6,554,974 B2 | 4/2003 | Shiratori ................ | 204/192.32 |
| 6,624,081 B2 * | 9/2003 | Dykstra et al. ............ | 438/710 |

FOREIGN PATENT DOCUMENTS

| | | | |
|---|---|---|---|
| JP | 1-301870 | 12/1989 | ............. G23F/4/00 |
| JP | 2001-167479 | 6/2001 | ............. G11B/7/26 |

* cited by examiner

*Primary Examiner*—Steven Versteeg
(74) *Attorney, Agent, or Firm*—Fitzpatrick, Cella, Harper & Scinto (57) ABSTRACT

A milling apparatus is provided in which temperature rise of a treatment-object in milling treatment, especially of the substrate thereof, is prevented. In the apparatus, ionization mechanism 2 comprises casing 20d having an opening at the center portion of the face thereof opposing to substrate 5 held by substrate holder 6; a filament is placed at the position where the straight line drawn from the filament to substrate 5 is intercepted by casing 20d; and electromagnets 31, 32 are provided around ionization mechanism 2 for generating a magnetic field to produce magnetic lines extending through opening 20j to substrate 5.

6 Claims, 6 Drawing Sheets

MILLING APPARATUS

BACKGROUND OF THE INVENTION

1. Field of the Invention

The present invention relates to a milling apparatus for production of semiconductor devices and the like. More specifically, the present invention relates to a milling apparatus for milling a substrate material by projection of rare gas ions generated by a thermoelectron emission type ionization mechanism.

2. Related Background Art

Milling processes are conventionally employed for preparation of electron microscope specimens, fine patterning of an object such as optical devices, magnetic bubble memories, and the like. The milling process is wanted to be improved for treatment at a lower temperature of a treatment object.

A production process which employs the milling treatment is explained by taking as an example a process for production of a magnetic domain wall displacement type magnetooptical disk disclosed in Japanese Patent Application Laid-Open No. 2001-167479. In the process for producing magnetooptical disk disclosed in this patent disclosure, lands and grooves which serve respectively as a track are formed alternately on an information plane with interposition of tilt zones having a face nonparallel to the information track plane, then a recording film is formed on the information track plane of a substrate of a recording medium, and the recording film deposited on the tilt zones is removed selectively.

This removal of the deposited film from the tilt zone prevents diffusion of the heat generated by a projected laser beam or by a heating means for magnetic domain displacement to the adjacent tracks on recording or reading, preventing the adverse effect of the heat on the recorded information on the adjacent track, namely cross-erasing/writing. The magnetooptical disks produced by such a process can be improved by narrowing the interval between the tracks, or increasing the track density, to increase the recording capacity without causing the cross-erasing/writing.

In this process for production of the magnetooptical disk, a milling treatment can be employed for removing the recording film from the tilt zones. For the magnetooptical disks, less temperature-resistant substrates are suitably used, such as polycarbonate plates, and glass plates covered with a resin layer. On the other hand, the milling is generally conducted by sputter-etching by projecting high-energy ions onto a substrate. The projected ions give a high energy to the substrate. Since this milling energy will raise the temperature of the substrate, a milling method is wanted which enables the treatment at a lower temperature to avoid the adverse effect on the substrate.

In a conventional milling process, ions are projected onto a substrate from an electron impact type ion gun placed in opposition thereto, generally with water cooling of the holder for holding the substrate to prevent excessive temperature rise of the substrate. Japanese Patent Application Laid-Open No. 1-301870 discloses a milling apparatus which uses an ion source similar to the one employed in a usual milling process but is provided with a substrate-holder equipped with a substrate-cooling mechanism of a water-cooling type to prevent the temperature rise of the substrate, and conducts milling by moving the substrate-holder between a treatment chamber and an annexed chamber.

However, in widely employed conventional milling processes, the radiant heat of the filament inside the ion-gun is introduced directly onto the substrate, which is one cause of temperature rise of the substrate. In conventional milling processes, an ion beam-neutralizing electron-emitting source is provided near the substrate to prevent the charging-up of the substrate, the radiation from the filament thereof being another cause of the temperature rise of the substrate. Further, in these processes, for directing the emitted gas ions to the substrate, an electrostatic force of a lead-in electrode is utilized with application of a constant voltage. The voltage applied to this electrode is controlled to be relatively high to direct the ions onto the substrate effectively. The higher lead-in voltage increases the energy of the projected ions to cause the temperature rise of the substrate.

Owing to the above causes, in the conventional milling processes, the temperature of the substrate rises inevitably to some extent even though the substrate is cooled indirectly by water-cooling of the substrate holder. When a substrate used has significantly low heat-resistance as in the aforementioned magnetooptical disks, the temperature rise cannot be kept sufficiently low not to cause deformation of the substrate or a like adverse effect.

The milling apparatus disclosed in Japanese Patent Application Laid-Open No. 1-301870 is improved in the setting and delivering means for the substrate for simplification, by using a substrate-cooling device similar to the one of conventional milling process. In the above apparatus, regarding the substrate cooling function, the substrate set on the substrate holder under an atmospheric pressure is milled as it is without transfer to another holder, whereby the substrate is pressed to the substrate holder to improve somewhat the cooling effect without remarkable improvement.

SUMMARY OF THE INVENTION

The present invention provides a milling apparatus useful for milling less temperature-resistant objects like substrates such as polycarbonate resins and glass plates covered with a resin layer without causing deformation of the substrate or a like adverse effect.

The milling apparatus of the present invention for etching a treatment-object by projecting a gas ionized by collision with thermoelectrons, the apparatus comprising:

a chamber capable of being evacuated;
a substrate holder for holding a treatment-object in the chamber;
a gas-introducing means for introducing a gas in the chamber;
a filament for emitting thermoelectrons by heating;
a grid for generating an electric field for accelerating the emitted thermoelectrons to collide with the gas;
a shield placed on a straight line drawn between the filament and the treatment-object held by substrate holder; and
plural magnetic field-generating means for generating a magnetic field for directing the ionized gas to the treatment-object.

DESCRIPTION OF THE PREFERRED EMBODIMENTS

The embodiments of the present invention are explained below by reference to the drawings.

Figure 1:
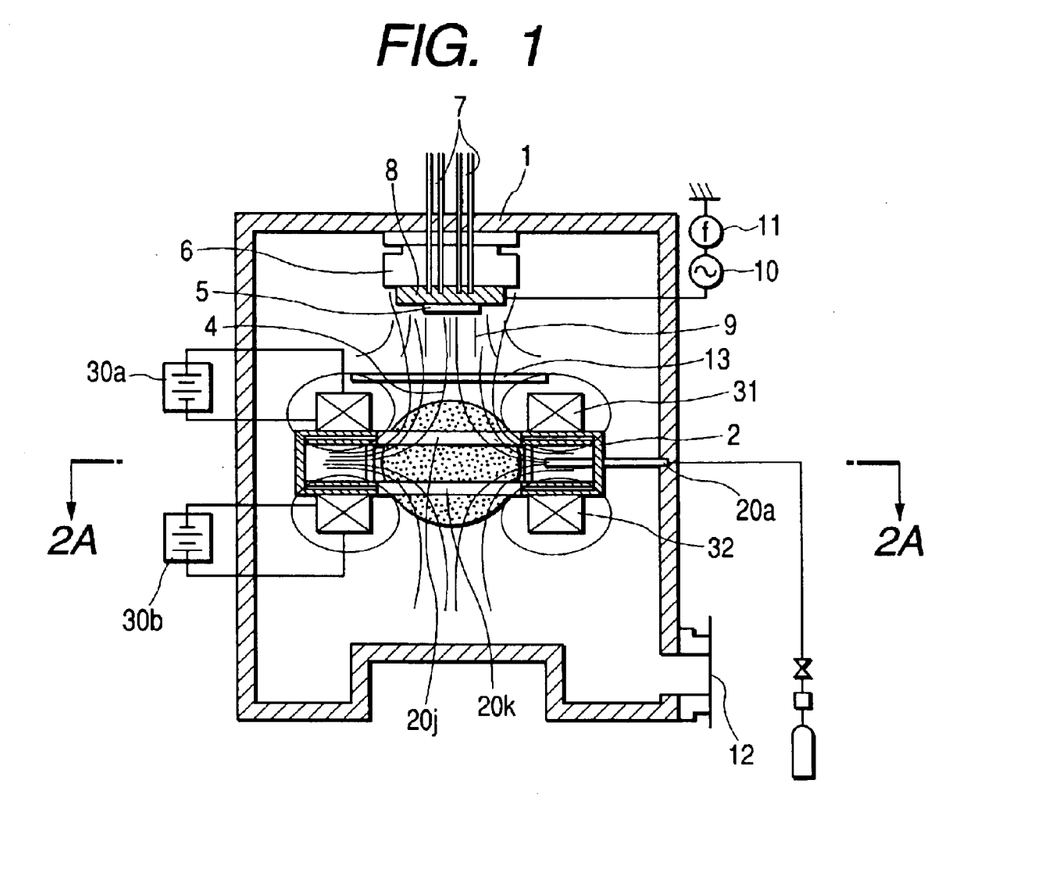
FIG. 1 shows a schematic sectional view illustrating constitution of a milling apparatus of an embodiment of the present invention.
Figure 2A:
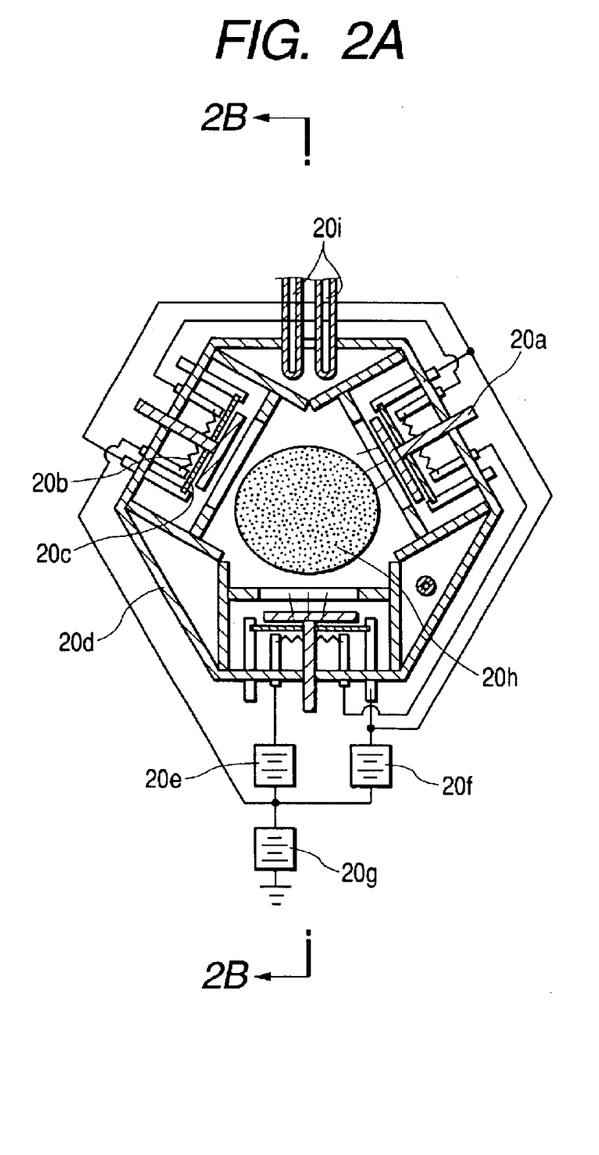
FIGS. 2A and 2B is a schematic sectional view of an ionization mechanism unit of the milling apparatus shown in FIG. 1.
Figure 2B:
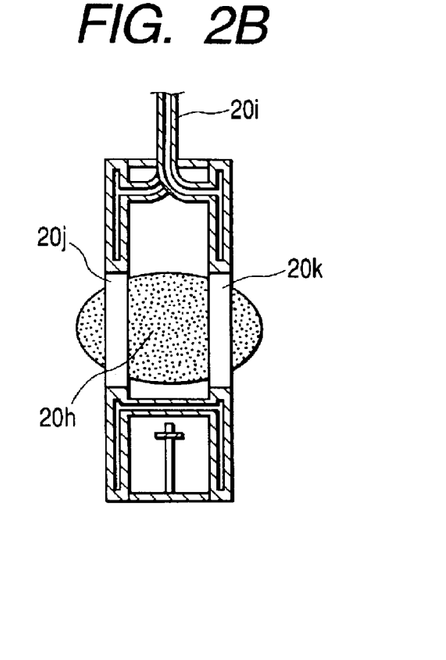

FIGS. 1, 2A, and 2B are schematic sectional views of a milling apparatus of the embodiment of the present invention. FIG. 2A is a sectional view of ionization mechanism 2 taken along line 2A—2A in FIG. 1. FIG. 2B is a sectional view taken along the line 2B—2B in FIG. 2A.

In the milling apparatus of this embodiment, the gas introduced into ionization mechanism 2 or vicinity thereof is ionized by thermoelectronic dissociation and a Penning ionization to generate ionization space 20h. The formed gas ions are propelled from ionization space 20h toward substrate 5 by the magnetic field formed by magnetic field-generating means 31, 32 by utilizing ambipolar diffusion. The gas ions are accelerated by electric field 9 formed near substrate 5 to shoot substrate 5 to mill a treatment object including substrate 5.

This milling apparatus has chamber 1 which can be kept airtight. The chamber 1 is constructed of a metal, and is grounded electrically. Chamber 1 is connected to evacuation system 12 which is a complex evacuation system capable of evacuating the chamber from atmospheric pressure to an internal pressure of about $1 \times 10^{-5}$ Pa. Evacuation system 12 has an evacuation rate-controller (not shown in the drawing), for example, a conductance valve, to control the evacuation rate. Chamber 1 has a gate valve (not shown in the drawing) for taking in or out substrate 5.

In chamber 1, substrate holder 6 is provided which is capable of holding substrate 5 at a prescribed position. Substrate holder 6 is fixed through an insulator onto the inside wall of chamber 1. On the face for holding substrate 5, lead-in electrode 8 is provided for generating electric field 9 for attracting the ions onto substrate 5. To lead-in electrode 8, a voltage-applying means is connected which comprises signal generator (function synthesizer) 11 for adjusting the applied voltage into a prescribed signal pattern, and power amplifier 10. In the substrate holder 6 and lead-in electrode 8, cooling water circulation path 7 is provided which is connected to cooling water (cooling medium) introducing means (not shown in drawing) for cooling of the substrate.

Ionization mechanism 2 of thermoelectron-emission type for generating gas ions is provided in opposition to the substrate-holding face of substrate holder 6 in chamber 1. Openable substrate-shutter 13 is provided between ionization mechanism 2 and substrate holder 6 to isolate them.

In the illustrated example, ionization mechanism 2 has an external shape of a hexagonal column, and has casing 20d having circular openings 20j, 20k at the center of the both end faces in the height direction. Casing 20d is held such that the one face having opening 20j is substantially parallel to the holding face of substrate holder 6. In casing 20d, three rooms are provided which have respectively an aperture facing to center portion where openings 20j, 20k are placed. The walls forming the three rooms have a jacket structure in which cooling water circulation path 20i is formed, and cooling water circulation path 20i is connected to a cooling water-introducing means not shown in the drawing.

In each of the three rooms, filament 20b is provided which generates heat and releases thermoelectrons by an electric current flow. Near each filament 20b on the side of openings 20j, 20k, grid 20c of a network structure is provided which produces an electric field for accelerating the released thermoelectrons toward the center. Further in each of the rooms, gas-introducing means 20a is provided near the grid 20c on the side of openings 20j, 20k.

On the end faces of casing 20d on which openings 20j, 20k are provided, electromagnets 31, 32 of a doughnut shape having a cavity at the center are provided. The electromagnets 31, 32 are connected to electromagnet power sources 30a, 30b.

Filaments 20b are connected in series, and one terminal of the series is connected to one pole of filament DC power source 20e. The voltage applied from filament DC power source 20e to the filaments can be either positive or negative. The other pole of filament DC power source 20e, negative pole of grid DC power source 20f and casing 20d are connected to one another to have a same potential, which are also connected to floating DC power source 20g. Floating DC power source 20g makes it possible to apply an optional voltage to them. Floating DC power source 20g in this embodiment exemplifies the application of a negative DC voltage. Although a voltage to be applied to grids 20c by grid DC power source 20f depends on a kind of gas to be ionized, the voltage is preferably set to 20 V or more.

In ionization mechanism 2, the respective filaments 20b are placed at positions not visible from the position of the substrate-holding face of substrate holder 6. That is, the respective filaments 20b are placed at the inner parts apart from opening 20j of casing 20d, whereby the substrate-holding face of substrate holder 6 is shielded from filaments 20b by the wall of casing 20d.

In electromagnets 31, 32 current is allowed to flow by electromagnet power sources 30a, 30b so as to make the magnetic field generated by electromagnet 31 opposite in polarity to that generated by electromagnet 32, whereby a Kapus magnetic field is formed in the center portion where opening 20j, 20k are provided. In the operation, this magnetic field serves to enclose electrons in the center and vicinity thereof to use this portion as ionization space 20h where the plasma is generated in a high density. For enclosing the electrons effectively, electromagnets 31, 32 are preferably constituted so as to generate a magnetic field at the magnetic flux density of 50 G (Gauss, 5 mT) especially at the periphery of opening 20j on the side of substrate 5 in ionization mechanism 2.

Electromagnets 31, 32 are constituted so as to generate a magnetic fields to have magnetic force lines 4 extending from filament 20b through grid 20c and opening 20j of ionization mechanism 2 to substrate 5 without penetrating casing 20d and the casing of electromagnet 31. With this constitution, the gas ions ionized in ionization space 20h are directed by the magnetic field generated by electromagnets 31, 32 by utilizing ambipolar diffusion to travel toward substrate 5. For correction of gas ion orbits to allow the produced gas ions to travel toward substrate 5, electromagnets 31, 32 are constituted preferably to produce a magnetic field with a magnetic flux density component perpendicular to the surface of substrate 5 of not less than 30 G (3 mT) at the center portion of the surface of substrate 5.

Next, the operation of this milling apparatus is explained below. Substrate 5 is inserted through a gate valve not shown in the drawing in chamber 1, and set on substrate holder 6. Then chamber 1 is evacuated to about $5 \times 10^{-5}$ Pa by evacuation system 12. Then cooling water is introduced into cooling-water circulation paths 7 in substrate holder 6 and lead-in electrode 8, and cooling-water path 20i in casing 20d of ionization mechanism 2, and the cooling water is circulated.

Electromagnets 31, 32 are energized to generate a magnetic field. The current flow caused by electromagnet power sources 30a, 30b is controlled to produce a Kapus magnetic field at and around the center of ionization space 20h as described above. As described above, the electromagnets are controlled preferably to produce a magnetic field with a magnetic flux density component perpendicular to the surface of substrate 5 of not less than 30 G at the center portion of the surface of substrate 5, and to obtain a magnetic flux density of not less than 50 G on the periphery of opening 20j of ionization mechanism 2.

Floating DC power source 20g and grid DC power source 20f are energized to set casing 20d and grid 20c respectively at the prescribed potential. Filament DC power source 20e is energized to flow electric current through filaments 20b and to emit thermoelectrons. The emitted thermoelectrons are accelerated by the electric field generated by grid 20c toward ionizing space 20h.

Signal generator 11 and power amplifier 10 are energized to apply a bias voltage to lead-in electrode 8, whereby lead-in electric field is formed in the direction perpendicular to the surface of substrate 5.

Figure 3:
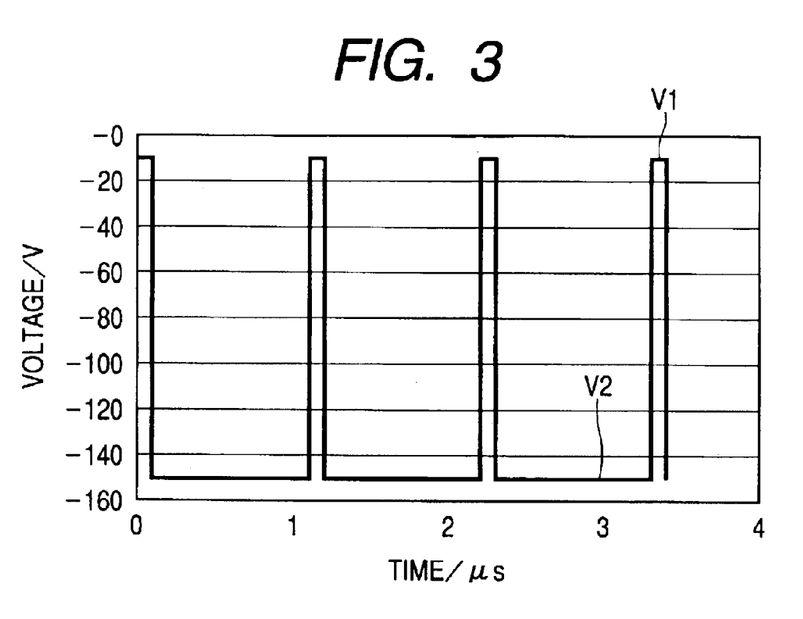
FIG. 3 is a graph showing an example of the waveform of the voltage applied to the lead-in electrode in the milling apparatus shown in FIG. 1.

The bias voltage applied to lead-in electrode 8 is negative to the ground potential as the reference potential, and is changed cyclically, like a rectangular pulse, trapezoidal pulse, or sawtooth wave. FIG. 3 shows an example of the waveform of the bias voltage. The bias voltage shown in FIG. 3 is a rectangular voltage changing at a prescribed cycling period between 0 or a minimum negative voltage V1 (a voltage of minimum deviation from the reference voltage) and a maximum negative voltage V2 (a voltage of maximum deviation from the reference voltage).

Then the gas is introduced through gas introducing means 20a. The pressure in chamber 1 is controlled to be at a prescribed pressure by controlling an evacuation rate controller (not shown in the drawing) of evacuation system 12. The introduced gas is ionized by collision with thermoelectrons emitted from filament 20b and accelerated by the electric field generated by grid 20c inside ionization mechanism 2 and inside ionization space 20h, and further ionized by Penning ionization. Thereby plasma is generated in a high density in ionization space 20h.

In this state, premilling is conducted for several minutes. After that, on opening substrate shutter 13, the gas ions diffusing by ambipolar diffusion are directed by the magnetic field generated by electromagnets 31, 32 to fly from ionization space 20h toward substrate 5. The gas ions coming near substrate 5 are accelerated by electric field 9 generated by lead-in electrode 8 to be projected onto the surface of substrate 5 substantially perpendicularly, whereby the milling treatment of substrate 5 is started.

After lapse of a prescribed time or after milling in a prescribed amount, shutter 13 is closed, and the following devices are stopped: signal generator 11, power amplifier 10; gas introducing means 20a, filament power source 20e, grid power source 20f, and floating power source 20g of ionization mechanism 2; and electromagnet power sources 30a, 30b. Several minutes later, the cooling water-introducing means (not shown in the drawing) for introducing cooling water into cooling water circulation path 7 in substrate holder 6 is stopped to stop the circulation of the cooling water. Finally, the gate valve (not shown in the drawing) is opened to allow chamber to leak, and substrate 5 is removed from substrate holder 6.

In the milling apparatus of this embodiment described above, the ionized gas is allowed to fly toward substrate 5 by the guide by the magnetic field produced by electromagnets 31, 32 utilizing ambipolar diffusion, differently from the conventional apparatus which emits thermoelectrons from a thermoelectron source toward a substrate and thereby allows gas ions to fly toward the substrate. Accordingly, in this embodiment, filament 20b heated at a high temperature need not be faced to substrate 5, but can be placed at a position not visible from the position of substrate 5. With this constitution, the radiation from filament 20b is intercepted by casing 20d to prevent substrate 5 from being heated by the radiation. Moreover, the cooling water circulating the cooling water circulation path 20i cools casing 20d to absorb the heat generated by filament 20b to prevent substantially transmission of the heat to substrate 5.

In this embodiment, a voltage which changes cyclically between zero or a minimum negative level and a maximum negative level is applied to lead-in electrode 8 as mentioned above. Thereby, the charging-up phenomenon is prevented even with substrate 5 made from a dielectric material. Therefore, the milling apparatus of this embodiment need not be provided with an ion beam-neutralizing electron emission source (filament) which is employed in prior art techniques. Therefore, the temperature rise of substrate 5 does not occur which may be caused by radiation from the ion beam-neutralizing electron emission source.

In the above embodiment, even with application of cyclically changing voltage, the gas ions are efficiently projected onto substrate 5 by setting the negative minimum voltage to enable projection of the gas ions onto substrate 5 during application of the voltage, and by setting the time length of application of the negative higher voltage to be longer and the time length of the application of lower voltage to be not long. More specifically, the minimum voltage is set at a potential between the floating potential and the plasma potential: the floating potential herein means the potential of electrically insulated substrate given by plasma when placed in the plasma (the floating potential corresponds to the potential of substrate 5 when no voltage is applied to lead-in electrode 8 in this embodiment). Generally this minimum voltage is preferably selected within the range from 0 V to −10 V. In employing a rectangle wave like that shown in FIG. 3, preferably the frequency is not less than 100 KHz, and the duty of the waveform is not less than 1:50. That is, the ratio of the time of application of V1 to the time of application of V2 is preferably 1/50 or less. The negative maximum voltage V2 of the rectangle wave may be set suitably depending on the material of substrate 5 and treatment object deposited on substrate 5, preferably in the range from −100 V to −250 V.

In this embodiment, the chamber 1 is made from a material such as stainless steel, and aluminum, generally having a volume from about 20 to about 500 liters. The gas introduced by gas-introducing means 20a is preferably a rare gas such as Ar, Kr, and Xe which give higher sputter ratio in ionization. Filament 20b is preferably made from a material such as ReW, and W exhibiting a higher thermoelectron emission factor. The mesh of grid 20c has preferably a breadth of about 1 mm, and a space of at about 3 mm between the mesh.

Electromagnets 31, 32 are used as the magnetic field generating means in this embodiment, but a permanent magnet may be used which is capable of producing a similar magnetic field. The means for applying the bias voltage to lead-in electrode 8 is shown to comprise signal generator 11, whereby a charging-up phenomenon is prevented even when substrate 5 is made of a dielectric material. However, with substrate 5 constituted only of an electroconductive material, a simple DC power source may be used as the means for applying the bias voltage to lead-in electrode 8. In this constitution, the charging-up phenomenon does not occur, and the ion beam-neutralizing electron emitting source need not be provided.

Specific examples of the milling treatment by use of the milling apparatus and Comparative Examples thereto are shown below.

Figure 4:
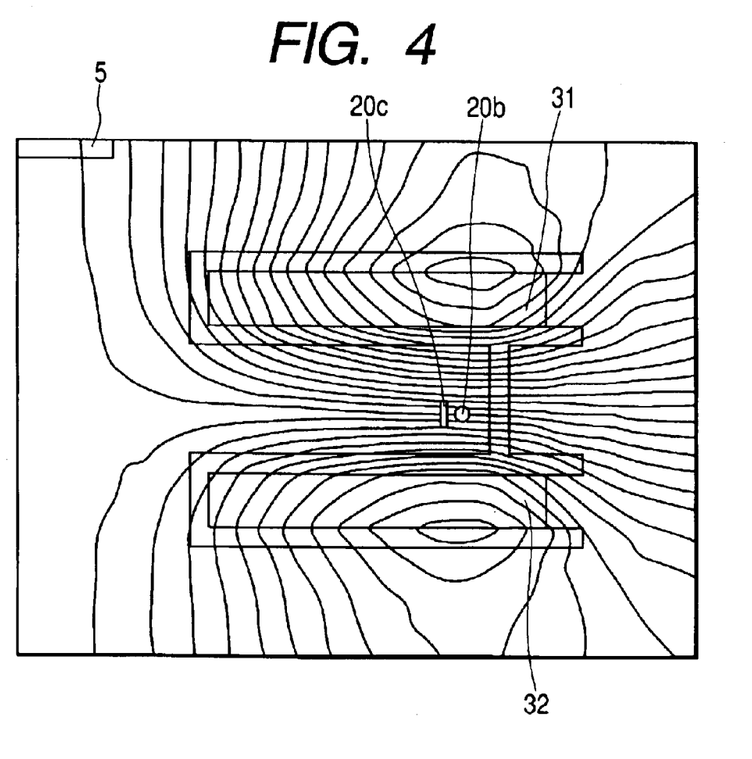
FIG. 4 shows a result of simulation of a magnetic field distribution in the milling apparatus shown in FIG. 1.

In examples below, simulation was conducted by employing a finite element method for setting the magnetic field distribution in ionization space 20h and around substrate 5. In this simulation, the magnetic field distribution is derived by inputting dimensions of substrate 5, and magnetic field-generating means 31, 32, and distance between opening of the ionization mechanism 2 and substrate 5; the coil turn numbers of magnetic field generating means 31, 32; and current intensities in the coils. FIG. 4 shows an example of the magnetic field distribution derived by the simulation.

The settings were made by employing this simulation to obtain the desired magnetic field distribution.

Preliminarily, the simulation was conducted for several current levels in electromagnets 31, 32 with change of the coil current intensity to obtain the magnetic field intensities around the main parts the and magnetic field distribution. Then a magnetic field is actually generated by flowing the simulated current through electromagnets 31, 32 provided in the milling apparatus, and the magnetic field intensities at the main parts were measured by means of a gauss meter. In the measurement of the magnetic field, the magnetic flux densities were measured in directions parallel to and perpendicular to the surface of substrate 5 around the main portions with a biaxial type probe which is capable of measuring simultaneously the magnetic flux densities in X-axis direction and Y-axis direction.

Further, the above simulation and the measurement were conducted by changing the distance from the end face having opening 20j of the ionization mechanism 2 to substrate 5 in the range form 20 mm to 50 mm. The practically measured magnetic field intensities were coincided with the values derived by the simulation within the error of ±10%. Thus, the magnetic distribution derived by simulation was found to represent approximately the magnetic distribution in the practical apparatus.

In the Examples below, firstly the simulation was conducted to estimate the currents to be applied to electromagnets 31, 32 to obtain the desired magnetic field distribution. Then with the currents applied, the magnetic flux densities were measured practically by use of a gauss meter at the center of the surface of substrate 5, and the periphery of opening 20j of ionization mechanism 2. The currents in electromagnets 31, 32 were controlled so as to obtain the desired magnetic flux densities.

EXAMPLE 1

Specimens were prepared from substrate 5 made of a polycarbonate resin of 2 inches (50.8 mm) in diameter having deposition films of $SiN_x$ (50 nm thick), and Fe (40 nm thick) deposited in the named order. The specimen was set in a milling apparatus having the same constitution as the one of the above embodiment. The upper Fe layer was eliminated by milling for 10 minutes under the milling conditions below.

Internal pressure in chamber 1: 0.1 Pa
Gas for Milling: Argon
Distance from the end face having opening 20j of ionization mechanism 2 to substrate 5: 20 mm
Size of the opening of ionization mechanism 2: 100 mm in diameter
Component the magnetic flux density perpendicular to the surface of substrate 5 at the center of substrate 5: 50 G
Magnetic flux density at a typical point of periphery of opening 20j of ionization mechanism 2: 80 G
(In the actual measurement, this value was derived by measuring the magnetic flux densities parallel to and perpendicular to substrate 5, and synthesizing the densities.)
Voltage applied to grid 20c: 50 V
Current flowing through grid 20c: 20 A
Floating voltage applied to casing 20d: −40 V
Voltage applied to lead-in electrode 8: rectangle voltage of minimum 0 V, maximum −130 V, frequency 500 kHz, and voltage duty 1:100
Current density of rare gas ions introduced to substrate 5: 1 mA/cm$^2$ Plural specimens were subjected to the milling treatment. Occurrence of deformation was examined by measuring warpage of the specimen at the position of 23 mm apart from the center by means of a tilt tester. Microscopic deformation was examined by a microscope and SEM. Table 1 shows the results. Symbols "A", "B" and "C" in the "Microscopic deformation" column of the table mean the followings:
A: No deformation of the sample was observed.
B: A deformation of the sample was observed but no melting of the sample was observed.
C: Both a deformation and melting of the sample were observed.

TABLE 1

| | Specimen No. | | | | |
|---|---|---|---|---|---|
| | 1 | 2 | 3 | 4 | 5 |
| Tilting (mRad) | 3.2 | 2.8 | 2.5 | 3.5 | 3.8 |
| Microscopic deformation | A | A | A | A | A |

Table 1 shows that, in this Example, all specimens gave satisfactory results, exhibiting warpage within the tolerable value of 6 mRad, and no significant deformation.

Comparative Example 1

With a conventional milling apparatus, the same specimens used in Example 1 were milled to eliminate the upper Fe layer. The milling conditions were shown below.
Internal pressure in the chamber: 0.1 Pa
Gas for Milling: Argon
Voltage applied to lead-in electrode 8: 400 V
Current density of rare gas ions introduced to substrate 5: 1 mA/cm$^2$ As the result, all the specimens warped remarkably, and the tilt measurement for examining deformation of the specimens in the same manner as in Example 1 could not be conducted. Further, by observation of the surfaces of the specimens by SEM, it was confirmed that the SiN$_x$ film was peeled, and the polycarbonate was melted.

Comparative Example 2

Specimens were milled in the same manner as in Example 1 except that filament 20b and grid 20c were placed at the positions to be visible from the position of substrate 5. Table 2 shows the results of measurement of warpage in the same manner as in Example 1.

TABLE 2

| | Specimen No. | | | | |
|---|---|---|---|---|---|
| | 1 | 2 | 3 | 4 | 5 |
| Tilting (mRad) | 120 | 100 | 80 | 130 | Not measurable |
| Microscopic deformation | C | B | B | B | C |

Symbols "A", "B" and "C" in the "Microscopic deformation" column of Table 2 represent are defined as the same as in the Table 1.

As shown in Table 2, all the specimens warped observable visibly. The polycarbonate was found to be melted partially.

EXAMPLE 2

Specimens were prepared as substrates 5 which were constituted of an Si wafer and an Al film of 200 nm thick formed thereon by sputtering. In this Example, to lead-in electrode 8 a constant voltage of −250 V was applied by connecting a DC power source in place of the voltage applying means comprising signal generator 11 and power amplifier 10. The milling was conducted by changing the current intensity flowing through filament 20b to change thereby the current intensity flowing through grid 20c with the other conditions being the same as in Example 1. In this Example, the current intensity of the ion introduced to substrate 5, and the rate of milling of the Al film were measured.

For comparison with the above milling, filaments 20b were displaced toward substrate 5 so that the magnetic lines from filament 20b toward substrate 5 are intercepted by casing 20d of ionization mechanism 2. In this Not-intercepting state, the milling was conducted in the same manner as above. In this comparative experiment also, the current intensity of the ion introduced to substrate 5, and the rate of milling of the Al film were measured.

Figure 5:
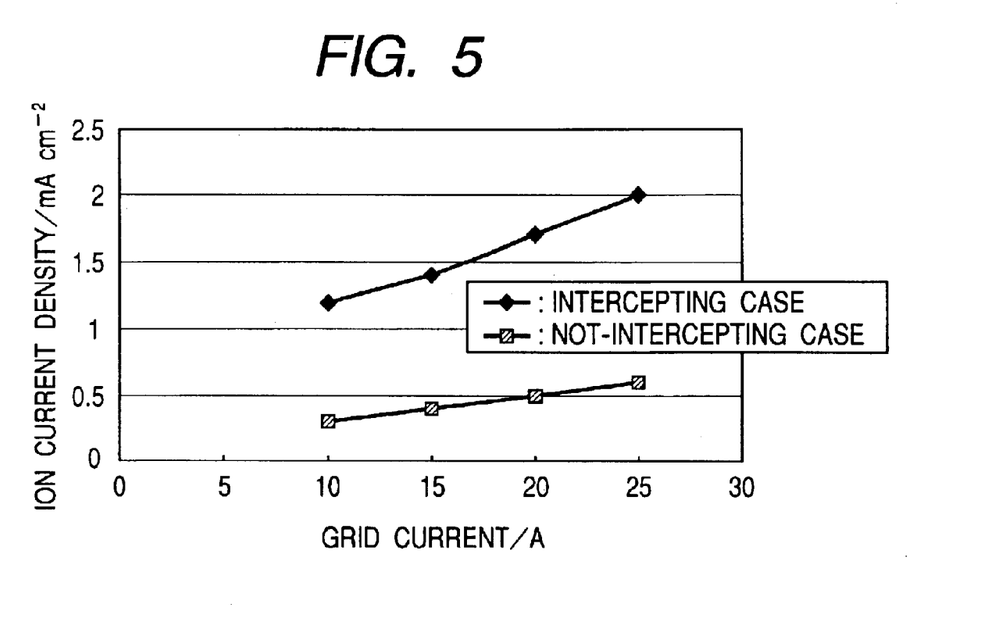
FIG. 5 is a graph showing the evaluation results in Example 2 of the present invention: the dependence of the ion current density on the grid current; for the magnetic force lines extending from the filament to the substrate being not intercepted by the casing of the ionization mechanism (not-intercepting case), and for the magnetic force lines being intercepted thereby (intercepting case).
Figure 6:
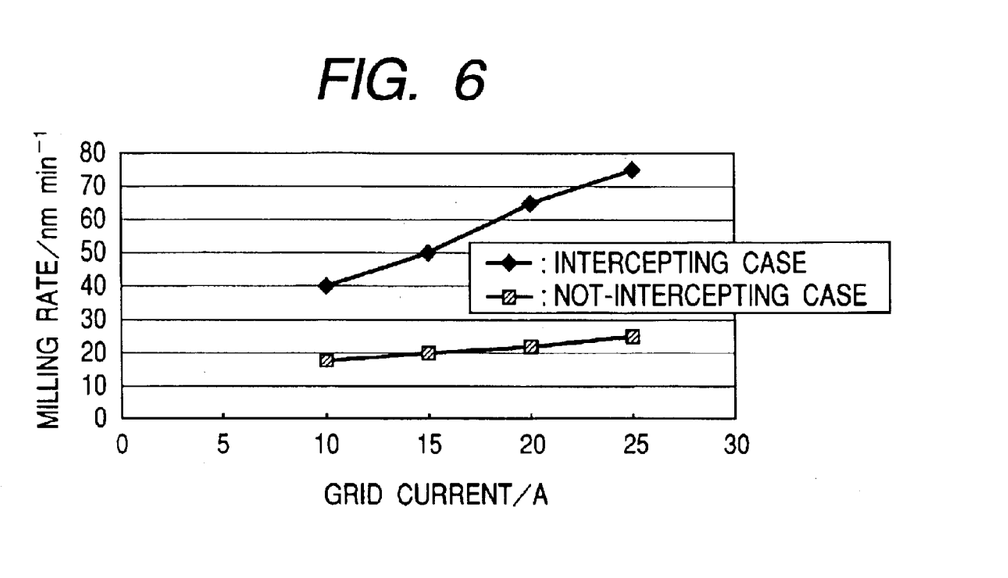
FIG. 6 is a graph showing the evaluation results in Example 2 of the present invention: the dependence of the milling rate on the grid current; for the magnetic force lines extending from the filament to the substrate being not intercepted by the casing of the ionization mechanism (not-intercepting case), and for the magnetic force lines being intercepted thereby (intercepting case).

The results of the measurement are shown in FIGS. 5 and 6. FIG. 5 is a graph showing the dependence of the ion current density introduced to substrate 5 on the current intensity through grid 20c. FIG. 6 is a graph showing the dependence of the Al film milling rate on the current intensity through grid 20c.

Obviously from FIGS. 5 and 6, the current density introduced to the specimen and the Al film milling rate are greatly increased with increase of the current flowing through filament 20b in all experiments when the magnetic lines from filament 20b through grid 20c to substrate 5 are not intercepted by casing 20d of ionization mechanism 2. Therefore, the milling can be conducted efficiently by adjusting the generated magnetic field to introduce gas ions efficiently to substrate 5.

EXAMPLE 3

In this Example, a magnetic field-correcting coil was additionally placed just above and just below magnetic coils 31, 32 respectively, and the magnetic field was changed by changing the currents in these four coils. Other conditions of the experiment were the same as in Example 2. The current intensity in grid 20c was kept constant to be 15 A.

Figure 7:
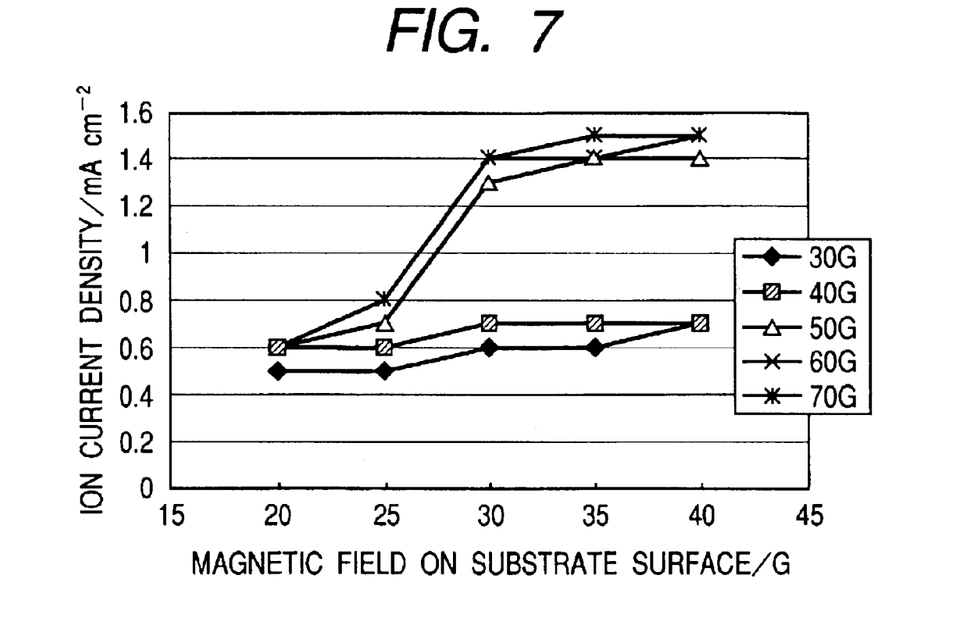
FIG. 7 is a graph showing the evaluation results in Example 3 of the present invention: the dependence of the ion current density on the magnetic flux density on the substrate surface and the magnetic flux density at the periphery of the aperture of the ionization mechanism.
Figure 8:
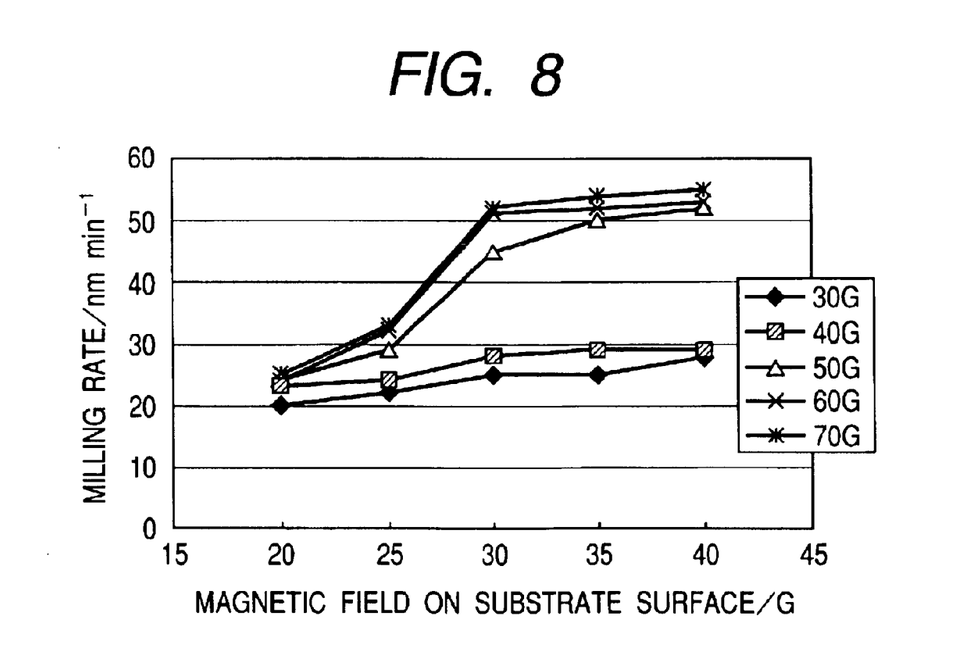
FIG. 8 is a graph showing the evaluation results in Example 4 of the present invention: the dependence of the milling rate on the magnetic flux density on the substrate surface and the magnetic flux density at the periphery of the aperture of the ionization mechanism.

In the experiment, the magnetic field was controlled to generate magnetic lines from filament 20b through grid 20c and the opening of ionization mechanism 2 to substrate 5 without penetrating the casings of ionization mechanism 2 and electromagnet 31. The milling was conducted by changing the magnetic line component of magnetic flux density perpendicular to surface of substrate 5 at the center of the surface thereof, and changing the magnetic flux density at the periphery of opening 20j of ionization mechanism 2. The ion current intensity introduced in the specimen and the rate of milling of Al of the specimen were measured. FIGS. 7 and 8 show the measurement results.

Obviously from FIGS. 7 and 8, the current density introduced to the specimen is greatly increased and the Al film milling rate is greatly increased by setting the magnetic line component of magnetic flux density perpendicular to surface of substrate 5 at the center of the surface thereof to be not lower than 30 G, and setting the magnetic flux density at the periphery of opening 20j of ionization mechanism 2 to be not lower than 50 G. Such setting of the magnetic field improves the milling efficiency.

EXAMPLE 4

This Example shows application of the milling method of the present invention to information recording medium production disclosed in Japanese Patent Application Laid-Open No. 2001-167479. The substrate for the information recording medium to be produced was a polycarbonate disk substrate of 50.8 mm in diameter having grooves of 160 nm in depth at 1.2-μm pitches formed thereon. This disk substrate was formed to have flat portions of about 0.5 μm in width, parallel to the face of the substrate, on the lands between the grooves and on the bottom face of the grooves, and to have tilt zones tilting at a tilting angle of about 60° to the substrate surface.

The disk substrate was placed in a multiple chamber type of composite treatment apparatus. The substrate was subjected to the treatments below in a vacuum without exposure to the air during the treatment.
1. $SiN_x$ film sputtering: 80 nm
2. TbFeCo film sputtering: 40 nm
3. TbFeCo film milling: 20 nm
4. $SiN_x$ film sputtering: 20 nm
5. Al film sputtering: 50 nm Of the above treatments, the milling treatment 3 was conducted by the milling method of the present invention, under the same milling conditions as in Example 1. The milling treatment was conducted to obtain a prescribed thickness, 20 nm in this Example, of the TbFeCo film on the land faces and the groove faces. By this milling treatment, the milling proceeds on the tilt zones at a higher rate than on the flat portions as disclosed in Japanese Patent Application Laid-Open No. 2001-167479. Thereby, the TbFeCo film on the tilt zones between the land and the groove was completely eliminated, baring the underlying $SiN_x$ film.

After completion of the above treatments, the disk substrate was taken out from the apparatus, and was coated with a UV resin. The sample prepared thus was subjected to the tilt measurement, and the warpage was found to be within 2 mRad, a permissible range.

The prepared disk was set on a driving apparatus having an optical head of laser wavelength 680 nm, and an objective lens of NA 0.55. The recording-reproduction characteristics were tested at the position of radius of 20 mm by a constant rotation period of 50 Hz. Specifically, (1-7)RLL data were recorded with mark edge at a recording bias magnetic field of 300 Oe (23.7 kA/m) by varying the recording power. As the laser wave for the recording, a laser pulse having a width of (n−1)T was projected by delaying the rise by 1 T in place of the pulse of width of nT corresponding to input signal. The clock frequency was adjusted to 25 MHz, and the minimum mark length was adjusted to 0.75 $\mu$m.

Figure 9:
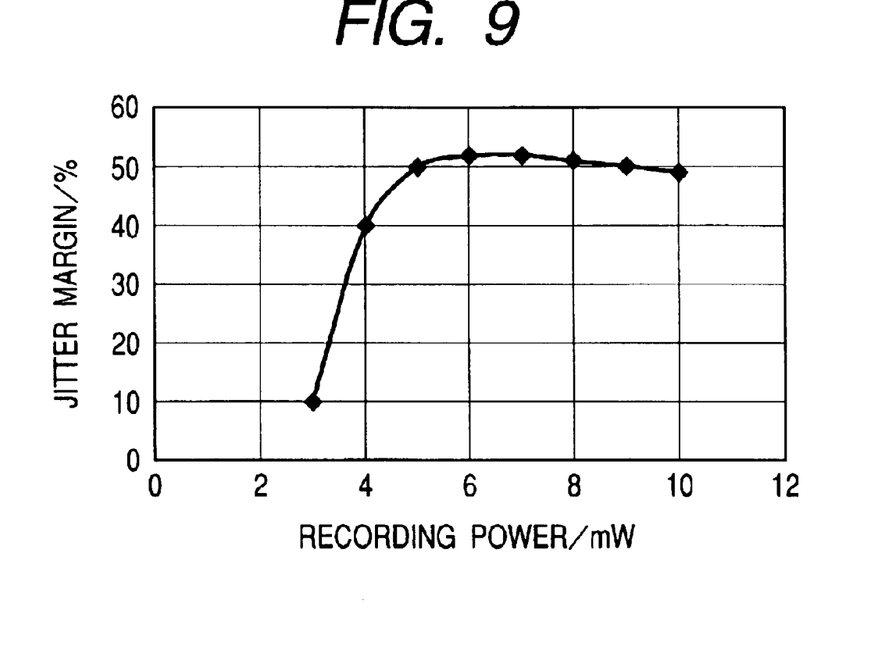
FIG. 9 is a graph showing the evaluation results in Example 5 of the present invention: the dependence of the jitter margin of the disk on the recording power.

The random data were reproduced with a reproducing power of 1.5 mW. The obtained analog signal waveform was sliced with a DC level to binalize the signals, and the intervals of rising edges were measured. Thereby, dependency of the jitter margin on the recording power was measured by deriving the jitter distribution from $10^5$ samples for the entire data pattern. FIG. 9 shows the results. As shown in FIG. 9, the information-recording medium prepared according to the present invention gave sufficient jitter margin in a wide range of recording power.

Figure 10:
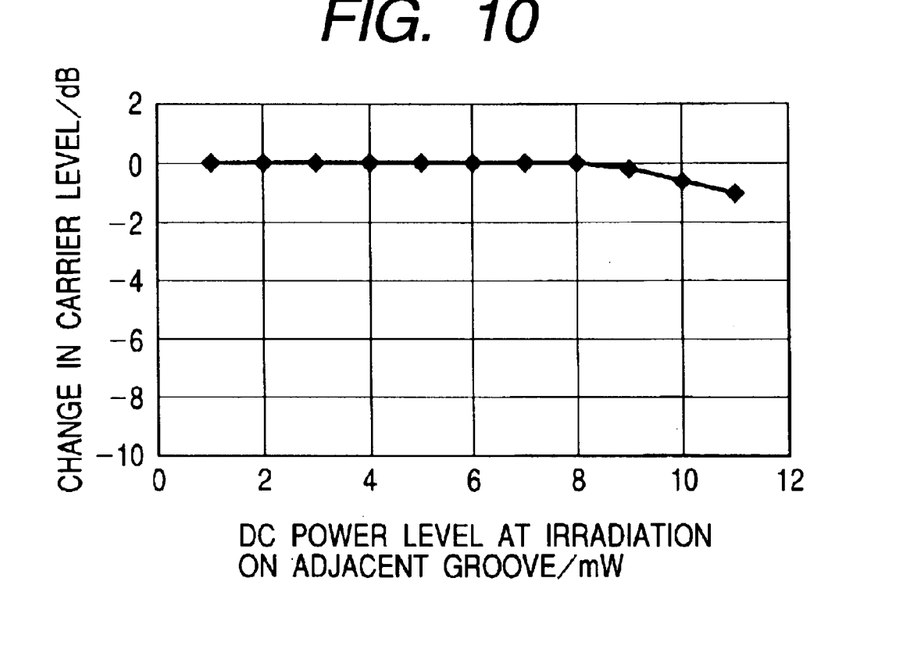
FIG. 10 is a graph showing the evaluation results in Example 5 of the present invention: the dependence of the carrier level change on the land of the disk upon the DC laser power projected onto the adjacent groove.

Next, cross-erasing/writing characteristics were measured. On the land, repeating pattern of mark length of 0.75 $\mu$m was recorded and the initial carrier level was measured. Then DC laser was projected onto the adjacent groove with a tracking servo. Thereafter the tracking was conducted onto the land and the carrier level was measured again. FIG. 10 shows dependency of the change of the carrier level from the initial level on the DC laser power projected onto the adjacent groove. As shown in FIG. 10, the carrier level was changed little by irradiation of laser on the adjacent groove. Thus it was confirmed that the information-recording medium prepared in this Example is less liable to cause cross-erasing/writing advantageously.

The above results show that the TbFeCo film on the tilt zone was effectively eliminated.

What is claimed is:

1. A milling apparatus for etching a treatment-object by projecting a gas ionized by collision with thermoelectrons, the apparatus comprising:
   a chamber capable of being evacuated;
   a substrate holder for holding a treatment-object in the chamber;
   a gas-introducing means for introducing a gas in the chamber;
   a filament for emitting thermoelectrons by heating;
   a grid for generating an electric field for accelerating the emitted thermoelectrons to collide with the gas;
   a shield placed on a straight line drawn between the filament and the treatment-object held by the substrate holder; and
   plural magnetic field-generating means for generating a magnetic field for directing the ionized gas to the treatment-object.

2. The milling apparatus according to claim 1, wherein the shield has an opening at the center thereof, and the plural magnetic field-generating means produces magnetic lines extending from the filament through the grid and the opening of the shield to the treatment-object.

3. The milling apparatus according to claim 2, wherein a Kapus magnetic field is generated at the center where the opening is provided.

4. The milling apparatus according to claim 3, wherein the plural magnetic field-generating means generate a magnetic field with a magnetic flux density component perpendicular to the surface of the treatment-object of not less than 30 G (3 mT) at the center portion of the surface of the treatment-object to be etched, and a magnetic flux density of not less than 50 G (5 mT) on the periphery of the opening of the shield.

5. The milling apparatus according to claim 1, wherein the apparatus further comprises a means for circulating a cooling medium through the shield.

6. The milling apparatus according to claim 1, wherein the apparatus further comprises a lead-in electrode for generating an electric field for directing the ionized gas to the treatment-object, and a voltage applying means for applying a voltage to the lead-in electrode with the voltage level changing periodically.

* * * * *

UNITED STATES PATENT AND TRADEMARK OFFICE
CERTIFICATE OF CORRECTION

PATENT NO. : 6,949,174 B2 Page 1 of 1
APPLICATION NO. : 10/444990
DATED : September 27, 2005
INVENTOR(S) : Hirohito Yamaguchi et al.

It is certified that error appears in the above-identified patent and that said Letters Patent is hereby corrected as shown below:

Column 5,
Line 11, "fields" should read -- field --.

Column 7,
Line 57, "the and" should read -- and the --.

Column 8,
Line 4, "form" should read -- from --; and
Line 61, "followings:" should read -- following: --.

Column 12,
Line 37, "generate" should read -- generates --.

Signed and Sealed this

Sixth Day of February, 2007

JON W. DUDAS
*Director of the United States Patent and Trademark Office*